United States Patent
Hsu

(10) Patent No.: US 8,351,209 B2
(45) Date of Patent: Jan. 8, 2013

(54) WIRELESS NETWORK RECEIVER

(75) Inventor: Chun-Yu Hsu, Taipei County (TW)

(73) Assignee: Bandrich, Inc., Taipei County (TW)

( * ) Notice: Subject to any disclaimer, the term of this patent is extended or adjusted under 35 U.S.C. 154(b) by 261 days.

(21) Appl. No.: 12/917,653

(22) Filed: Nov. 2, 2010

(65) Prior Publication Data

US 2012/0106089 A1     May 3, 2012

(51) Int. Cl.
*H05K 7/20*     (2006.01)
(52) U.S. Cl. ........ 361/719; 361/704; 361/707; 361/720; 361/721; 165/80.3; 165/185
(58) Field of Classification Search ................. None
See application file for complete search history.

(56) References Cited

U.S. PATENT DOCUMENTS

| | | | |
|---|---|---|---|
| 7,362,585 B2 * | 4/2008 | Chen et al. | 361/729 |
| 7,471,965 B2 * | 12/2008 | Jeon | 455/575.1 |
| 7,586,744 B2 * | 9/2009 | Okuda | 361/679.56 |
| 7,609,513 B2 * | 10/2009 | Chang | 361/679.46 |
| 7,952,881 B2 * | 5/2011 | Magana et al. | 361/719 |
| 2012/0004012 A1 * | 1/2012 | Hamblin et al. | 455/550.1 |

* cited by examiner

*Primary Examiner* — Boris Chervinsky

(74) *Attorney, Agent, or Firm* — Rosenberg, Klein & Lee

(57) ABSTRACT

A wireless network receiver includes a heat-dissipating unit, a wireless network receiving module, an electrical connecting unit, and a shell unit. The heat-dissipating unit has at least one main heat-dissipating body and a front heat-dissipating body extended forward from the main heat-dissipating body. The wireless network receiving module is disposed on the heat-dissipating unit, and the wireless network receiving module includes a first substrate unit and a second substrate unit electrically connected to the first substrate unit. The electrical connecting unit includes an electrical connecting casing contacting the front heat-dissipating body and enveloping the front heat-dissipating body and a front portion of the first substrate unit. The shell unit includes a shell module for selectively exposing or hiding the electrical connecting unit.

20 Claims, 7 Drawing Sheets

WIRELESS NETWORK RECEIVER

BACKGROUND OF THE INVENTION

1. Field of the Invention

The instant disclosure relates to a wireless network receiver, and more particularly, to a wireless network receiver for increasing heat-dissipating efficiency.

2. Description of Related Art

The development of the Internet and the popularization of personal computers enable data from different places to be communicated. However, most of the current Internet infrastructure is connected with wires made of different materials, such as optical fibers. With the expansion of wired network, the costs of running interne cables and maintenance are very high. Thus, using wireless network card can eliminate the aforementioned problems and creates a convenient communications environment.

Typically, portable information technology (IT) products, such as laptops, require wireless cards to enable wireless communications. Wireless cards have various designs and features based on the specifications of different wireless communication protocols. Developments and growth of the next generation mobile communication technologies increase communication quality and data transmission speed. Recently, major mobile communication technologies focus on accelerating data transmission speed and improving data transmission quality. Several major mobile communication protocols, such as globe system for mobile communications (GSM) of second generation (2G) standards, general packet radio service (GPRS) of 2.5G standards, wideband code division multiple access (WCDMA) of 3G standards and even recent high speed downlink packet access (HSDPA) of 3.5G standards have been developed and continuously improved to substantially accelerate the transmission speed.

Generally, the wireless cards use antennas to receive and transmit wireless signals. Antenna dimension, size and location are major design challenges that influence the performance of signal reception and transmission. Further, different countries adopt different mobile communication technologies and different band frequencies. User environment of the portable electronic device is varied following the mobility of the user. Thus, using a single antenna does not satisfy the requirements of good signal reception and transmission.

The wireless network card can be replaced by wireless network receiver that has an interface to connect to the computer. The interface may be a universal serial bus (USB) interface. The USB interface is usually capped with a detachable cap to protect the USB interface. However, the detachable cap may easily be lost, disappear or become loosened with the USB interface after a period of time. Thus, the USB interface is lack of protection. The collision between the USB and the surrounding environment would reduce the life of the USB interface. For the foregoing reasons, there is a need for protecting the USB interface efficiently.

Moreover, the wireless network receiver would generate high heat during operation, but the heat generated by the wireless network receiver can not be dissipated efficiently in the prior art.

SUMMARY OF THE INVENTION

One particular aspect of the instant disclosure is to provide a wireless network receiver for increasing heat-dissipating efficiency.

In order to achieve the above-mentioned advantage, the instant disclosure provides a wireless network receiver, including: a heat-dissipating unit, a first substrate unit, a second substrate unit, an electrical connecting unit and a shell unit. The heat-dissipating unit has at least one main heat-dissipating body and a front heat-dissipating body extended forward from the main heat-dissipating body. The first substrate unit is disposed on the heat-dissipating unit and contacting the heat-dissipating unit. The first substrate unit includes at least one first function circuit board and a plurality of first function chips electrically connected to the first function circuit board, and the first function circuit board has an external circuit board extended forward from a front side thereof and disposed on the front heat-dissipating body. The second substrate unit is electrically connected to the first substrate unit and contacting the heat-dissipating unit. The second substrate unit includes at least one second function circuit board electrically connected to the first function circuit board and a plurality of second function chips electrically connected to the second function circuit board. The electrical connecting unit includes an electrical connecting casing contacting the front heat-dissipating body and enveloping the front heat-dissipating body and the external circuit board. The shell unit includes a shell module for enveloping the heat-dissipating unit, the first substrate unit and the second substrate unit and selectively exposing or hiding the electrical connecting unit.

In order to achieve the above-mentioned advantage, the instant disclosure provides a wireless network receiver, including: a heat-dissipating unit, a first substrate unit, a second substrate unit, an electrical connecting unit and a shell unit. The heat-dissipating unit has at least one main heat-dissipating body and a front heat-dissipating body extended forward from the main heat-dissipating body. The first substrate unit is disposed on the heat-dissipating unit, and the first substrate unit includes at least one first function circuit board and a plurality of first function chips electrically connected to the first function circuit board. The second substrate unit is electrically connected to the first substrate unit. The second substrate unit includes at least one second function circuit board electrically connected to the first function circuit board and a plurality of second function chips electrically connected to the second function circuit board. The electrical connecting unit includes an electrical connecting casing contacting the front heat-dissipating body and enveloping the front heat-dissipating body and a front portion of the first function circuit board. The shell unit includes a shell module for selectively exposing or hiding the electrical connecting unit.

In order to achieve the above-mentioned advantage, the instant disclosure provides a wireless network receiver, including: a heat-dissipating unit, a wireless network receiving module, an electrical connecting unit and a shell unit. The heat-dissipating unit has at least one main heat-dissipating body and a front heat-dissipating body extended forward from the main heat-dissipating body. The wireless network receiving module is disposed on the heat-dissipating unit, and the wireless network receiving module includes a first substrate unit and a second substrate unit electrically connected to the first substrate unit. The electrical connecting unit includes an electrical connecting casing contacting the front heat-dissipating body and enveloping the front heat-dissipating body and a front portion of the first substrate unit. The shell unit includes a shell module for selectively exposing or hiding the electrical connecting unit.

Therefore, the heat-dissipating efficiency of the instant disclosure can be increased due to the design of the lateral heat-dissipating fins of each lateral heat-dissipating body and the bottom heat-dissipating fins of the main heat-dissipating body. In other words, the hollow casing portion of the electrical connecting casing is disposed around and contacts the front heat-dissipating body, thus not only heat can be directly transmitted from the front heat-dissipating body and the second function circuit board to the hollow casing portion, but also the heat received by the hollow casing portion can be transmitted to a computer that has been electrically connected to the electrical connecting casing.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Figure 1:
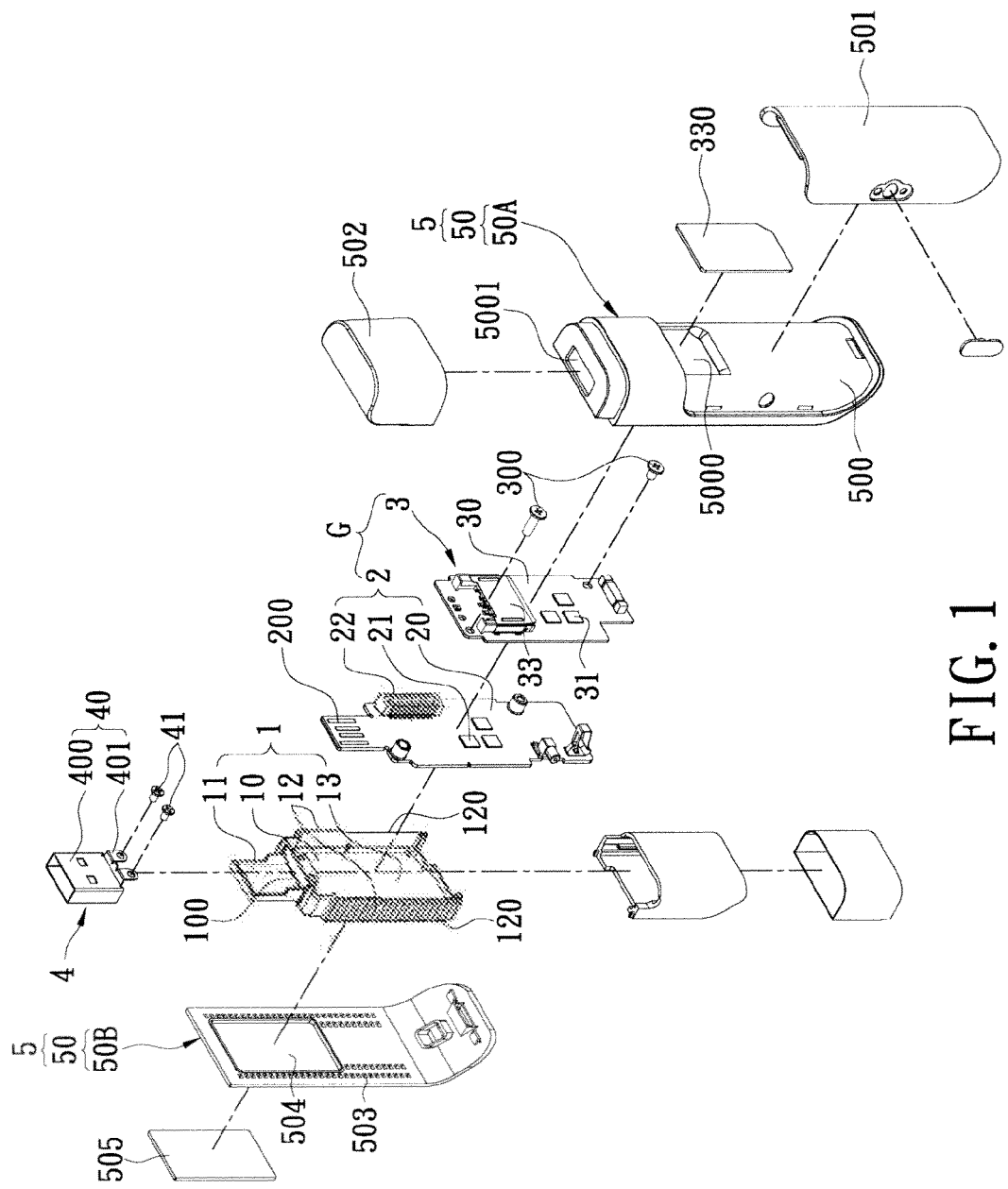
FIG. 1 shows one perspective, exploded, schematic view of the wireless network receiver according to the instant disclosure.

Referring to FIGS. 1 to 7, the instant disclosure provides a wireless network receiver for increasing heat-dissipating efficiency, including: a heat-dissipating unit 1, a first substrate unit 2, a second substrate unit 3, an electrical connecting unit 4 and a shell unit 5.

Figure 2:
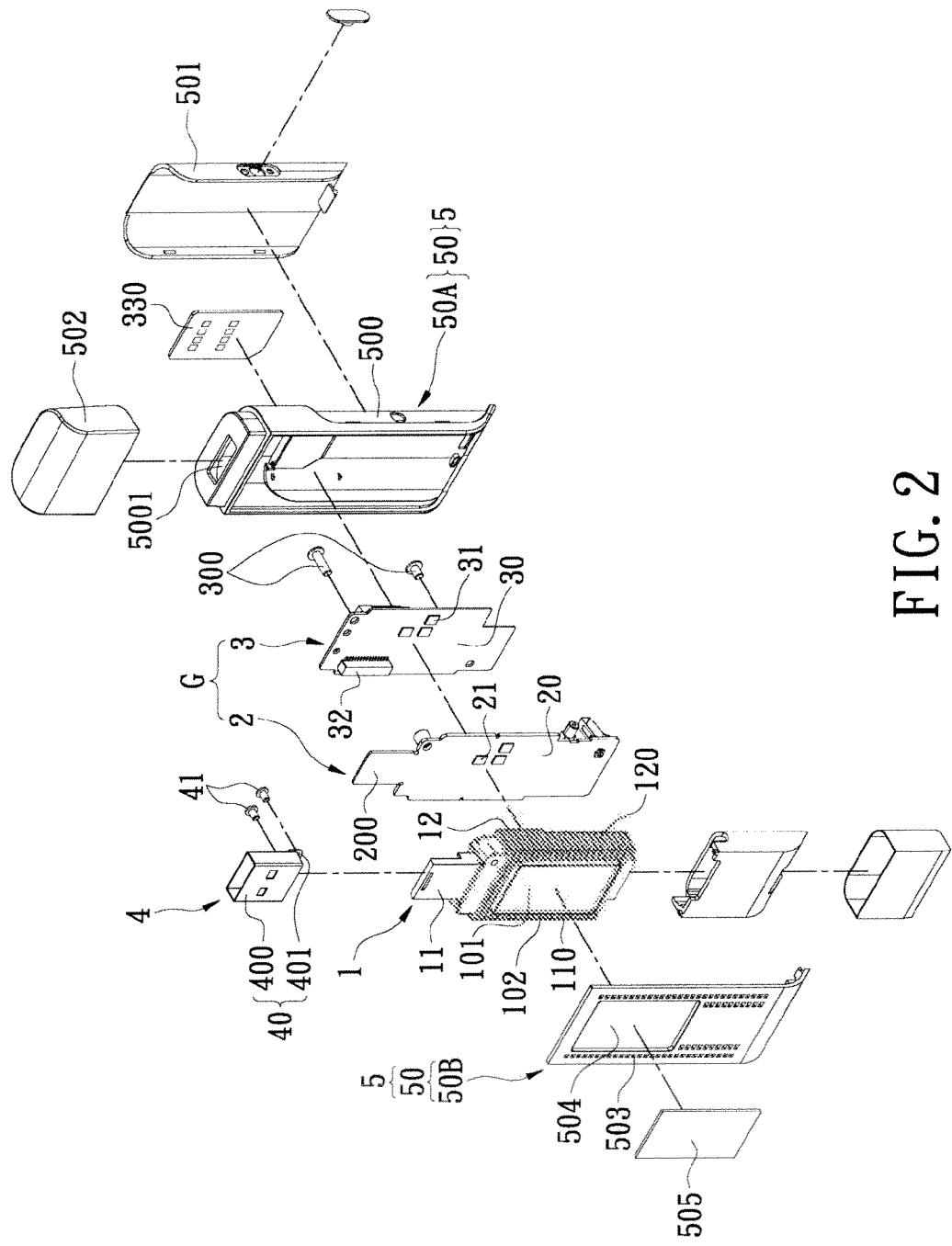
FIG. 2 shows another perspective, exploded, schematic view of the wireless network receiver according to the instant disclosure.

Referring to FIGS. 1 and 2, the heat-dissipating unit 1 has at least one main heat-dissipating body 10 and a front heat-dissipating body 11 extended forward from the main heat-dissipating body 10. In addition, the heat-dissipating unit 1 has at least two lateral heat-dissipating bodies 12 respectively extended upward from two opposite lateral sides of the main heat-dissipating body 10, and the heat-dissipating unit 1 has a receiving space 13 formed on the main heat-dissipating body 10 and between the two lateral heat-dissipating bodies 12. Moreover, each lateral heat-dissipating body 12 has a plurality of lateral heat-dissipating fins 120 projected outward from an outer surface thereof, and the main heat-dissipating body 10 has a plurality of bottom heat-dissipating fins 110 projected downward from a bottom side thereof (as shown in FIG. 2). Hence, the heat-dissipating efficiency of the instant disclosure can be increased due to the design of the lateral heat-dissipating fins 120 of each lateral heat-dissipating body 12 and the bottom heat-dissipating fins 110 of the main heat-dissipating body 10.

Figure 3:
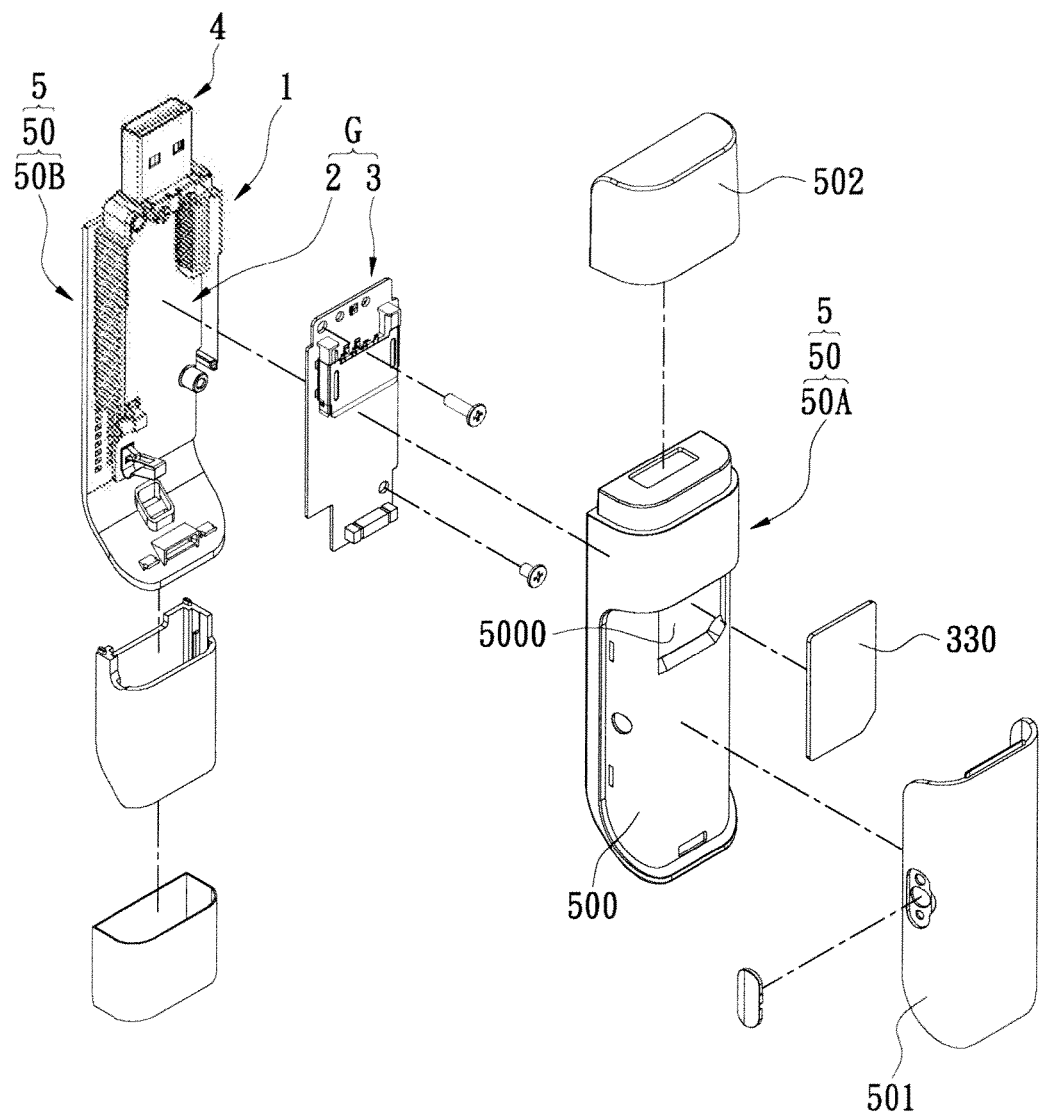
FIG. 3 shows a first, partial, assembled, schematic view of the wireless network receiver according to the instant disclosure.

Referring to FIGS. 1 to 3, the first substrate unit 2 is disposed on the heat-dissipating unit 1 and contacts the heat-dissipating unit 1. For example, the first substrate unit 2 includes at least one first function circuit board 20 and a plurality of first function chips 21 electrically connected to and disposed on the first function circuit board 20, and the first function circuit board 20 has an external circuit board 200 extended forward from a front side thereof and disposed on the front heat-dissipating body 11. The external circuit board 200 can pass through a through hole 100 between the main heat-dissipating body 10 and the front heat-dissipating body 11 and contact the front heat-dissipating body 11. In addition, the first function circuit board 20 can be received in the receiving space 13 (as shown in FIG. 3), thus the two lateral heat-dissipating bodies 12 can respectively contact two opposite lateral sides of the first function circuit board 20.

Figure 4:
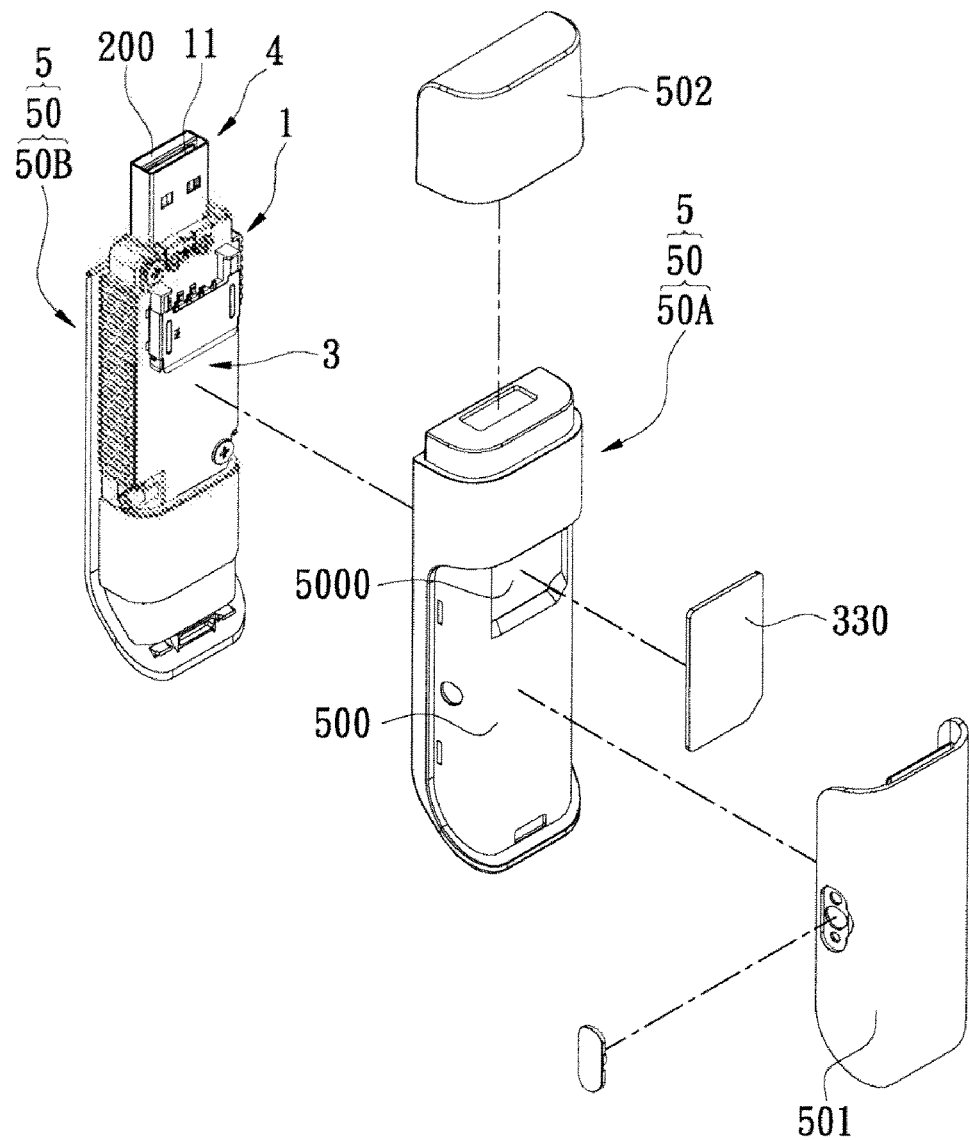
FIG. 4 shows a second, partial, assembled, schematic view of the wireless network receiver according to the instant disclosure.
Figure 5:
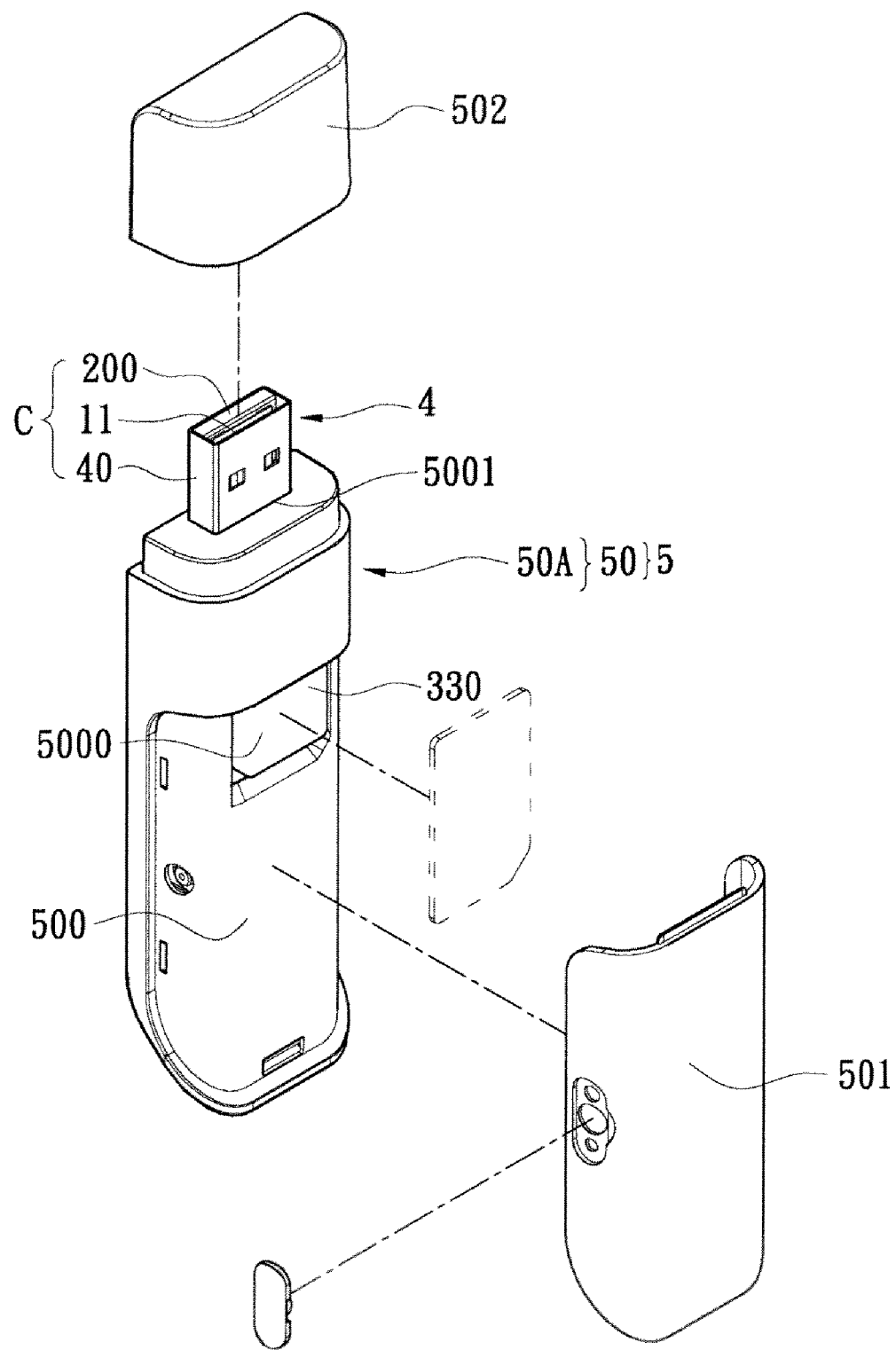
FIG. 5 shows a third, partial, assembled, schematic view of the wireless network receiver according to the instant disclosure.
Figure 6:
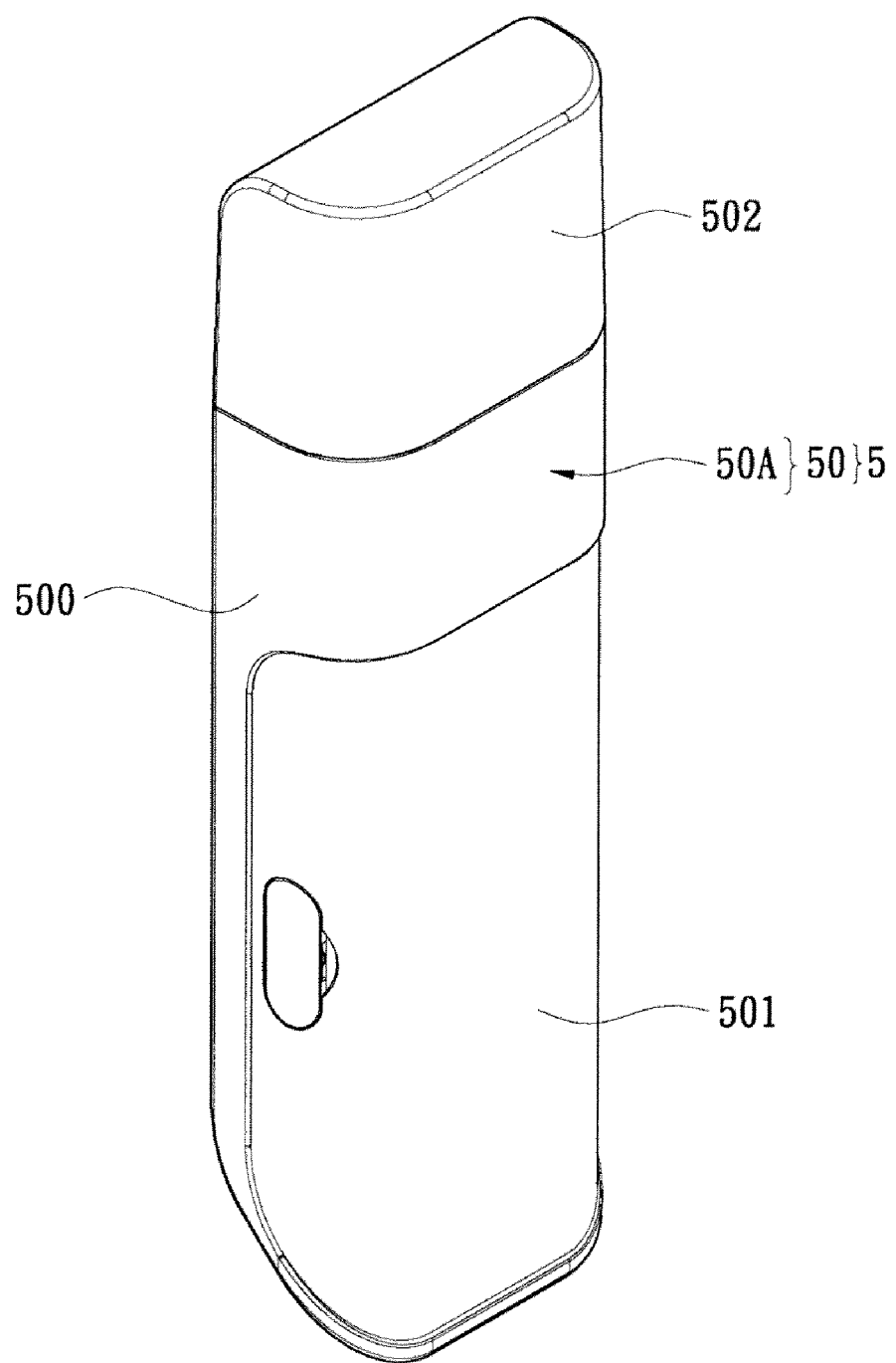
FIG. 6 shows one perspective, assembled, schematic view of the wireless network receiver according to the instant disclosure.

Referring to FIGS. 1, 2 and 4, the second substrate unit 3 is electrically connected to the first substrate unit 2 and contacts the heat-dissipating unit 1. For example, the second substrate unit 3 includes at least one second function circuit board 30 electrically connected to the first function circuit board 20 and a plurality of second function chips 31 electrically connected to and disposed on the second function circuit board 30. In addition, the second function circuit board 30 can be positioned above the first function circuit board 20 through at least two fixing elements 300 such as screws. Moreover, the second function circuit board 30 can be received in the receiving space 13 (as shown in FIG. 4), thus the two lateral heat-dissipating bodies 12 can respectively contact two opposite lateral sides of the second function circuit board 30.

Furthermore, the first substrate unit 2 includes a first electrical connector 22 (as shown in FIG. 1) disposed on and electrically connected to the first function circuit board 20, the second substrate unit 3 includes a second electrical connector 32 (as shown in FIG. 2) disposed on and electrically connected to the second function circuit board 30, thus the first function circuit board 20 and the second function circuit board 30 can be electrically connected with each other by matching the first electrical connector 22 and the second electrical connector 32. In other words, the second substrate unit 3 can be positioned on the first substrate unit 2 through the two fixing elements 300 and can be electrically connected to the first substrate unit 2 by matching the first electrical connector 22 and the second electrical connector 32. In addition, the second substrate unit 3 has a SIM card connector 33 (as shown in FIGS. 1 and 4) electrically connected to and disposed on the second function circuit board 30, thus a SIM (Subscriber Identity Module) card 330 can be selectively inserted into the SIM card connector 33.

Referring to FIGS. 1, 2 and 4, the electrical connecting unit 4 includes an electrical connecting casing 40 contacting the front heat-dissipating body 11 and enveloping the front heat-dissipating body 11 and the external circuit board 200, wherein the front heat-dissipating body 11 can be a front portion of the first function circuit board 20 or the first substrate unit 2. In addition, the electrical connecting casing 40 can be fixed on the heat-dissipating unit 1 through a plurality of fixing elements 41 such as screws. For example, the electrical connecting casing 40 has a hollow casing portion 400 and a positioning portion 401 connected to the hollow casing portion 400. The fixing elements 41 can pass through the second function circuit board 30 and the positioning portion 401 of the electrical connecting casing 40 to simultaneously secure the second function circuit board 30 and the hollow casing portion 400 on the heat-dissipating unit 1. Moreover, the hollow casing portion 400 of the electrical connecting casing 40 is disposed around and contacts the front heat-dissipating body 11, thus not only heat can be directly transmitted from the front heat-dissipating body 11 and the second function circuit board 30 to the hollow casing portion 400, but also the heat received by the hollow casing portion 400 can be transmitted to a computer (not shown) that has been electrically connected to the electrical connecting casing 40.

Referring to FIGS. 1, 2, 5 and 6, the shell unit 5 includes a shell module 50 for enveloping the heat-dissipating unit 1, the first substrate unit 2 and the second substrate unit 3 and selectively exposing or hiding the electrical connecting unit 4. For example, the shell module 50 includes a top shell 50A and a bottom shell 50B mated with the top shell 50A. The top shell 50A includes a main body 500 for enveloping the heat-dissipating unit 1, the first substrate unit 2 and the second substrate unit 3 and exposing the electrical connecting unit 4, a top cover 501 disposed on the main body 500 and a front cover 502 mated with a front portion of the main body 500 for enveloping the electrical connecting casing 40. The main body 500 has a top opening 5000 for exposing the SIM card connector 33, and the top opening 5000 can be closed by the top cover 501. The main body 500 of the shell module 50 has a front opening 5001 for exposing an external electrical connector C that can be composed of the front heat-dissipating body 11, the external circuit board 200 and the electrical connecting casing 40. In other words, the external electrical connector C can pass through the front opening 5001 and be exposed from the main body 500, and the exposed external electrical connector C can be enveloped and shaded by the front cover 502.

Figure 7:
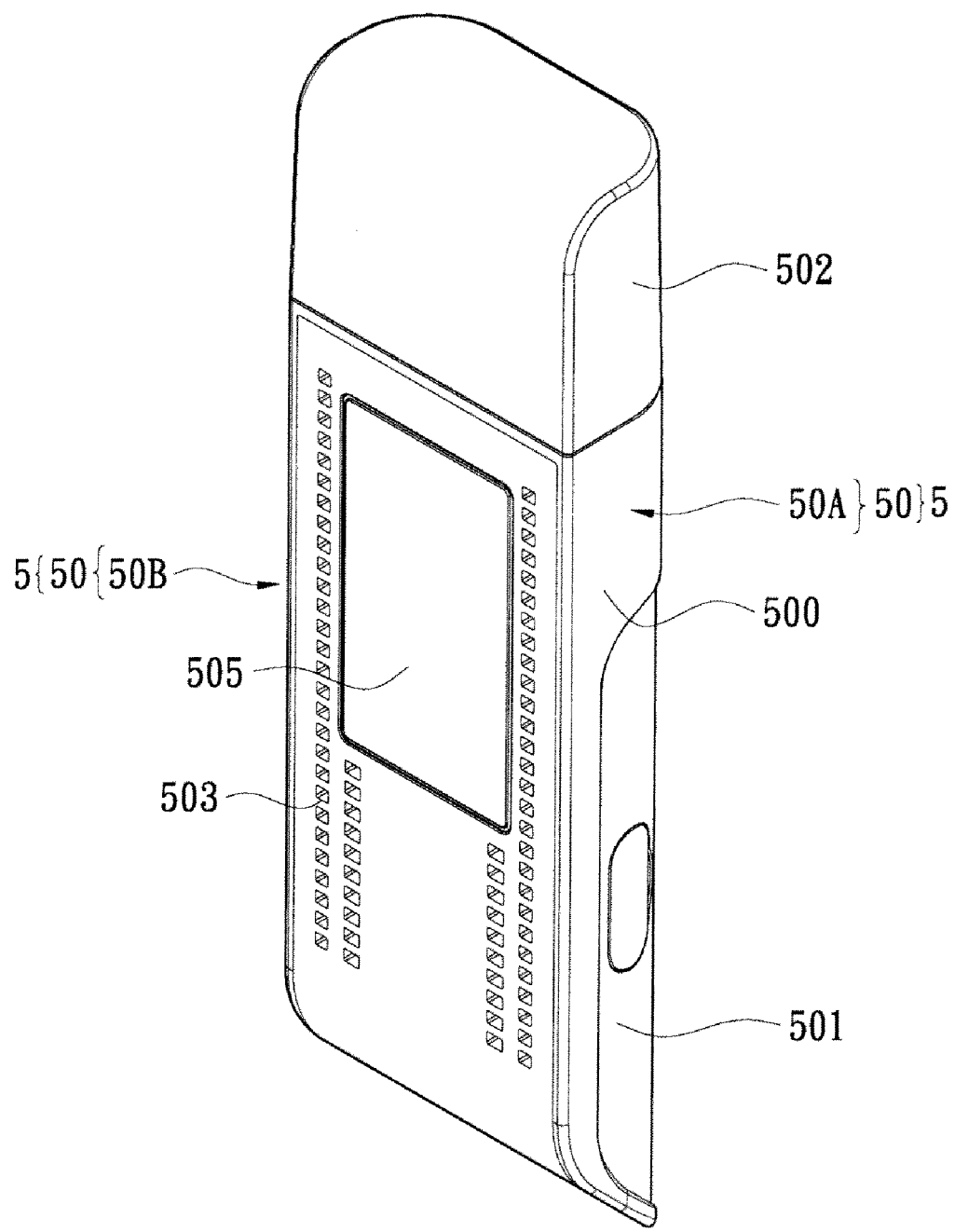
FIG. 7 shows another perspective, assembled, schematic view of the wireless network receiver according to the instant disclosure.

Referring to FIGS. 1, 2 and 7, the main heat-dissipating body 10 has a receiving groove 101 formed on the bottom surface thereof. The bottom shell 50B has a plurality of heat-dissipating holes 503, a heat-dissipating opening 504 for exposing the receiving groove 101 and a shielding board 505 received in the heat-dissipating opening 504, and the shielding board 505 can be made of plastic material. In addition, the main heat-dissipating body 10 has an annular heat-dissipating portion 102 disposed on the bottom surface thereof and between the inner surface of the heat-dissipating opening 504 and the shielding board 505.

In other words, the instant disclosure can provide a wireless network receiver, including: a heat-dissipating unit 1, a wireless network receiving module G, an electrical connecting unit 4 and a shell unit 5. The heat-dissipating unit 1 has at least one main heat-dissipating body 10 and a front heat-dissipating body 11 extended forward from the main heat-dissipating body 10. The wireless network receiving module G is disposed on the heat-dissipating unit 1, and the wireless network receiving module G includes a first substrate unit 2 and a second substrate unit 3 electrically connected to the first substrate unit 2. The electrical connecting unit 4 includes an electrical connecting casing 40 contacting the front heat-dissipating body 11 and enveloping the front heat-dissipating body 11 and the front portion of the first substrate unit 2. The shell unit 5 includes a shell module 50 for selectively exposing or hiding the electrical connecting unit 4.

In conclusion, the heat-dissipating efficiency of the instant disclosure can be increased due to the design of the lateral heat-dissipating fins of each lateral heat-dissipating body and the bottom heat-dissipating fins of the main heat-dissipating body. In other words, the hollow casing portion of the electrical connecting casing is disposed around and contacts the front heat-dissipating body, thus not only heat can be directly transmitted from the front heat-dissipating body and the second function circuit board to the hollow casing portion, but also the heat received by the hollow casing portion can be transmitted to a computer that has been electrically connected to the electrical connecting casing.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A wireless network receiver, comprising:
a heat-dissipating unit having at least one main heat-dissipating body and a front heat-dissipating body extended forward from the at least one main heat-dissipating body;
a first substrate unit disposed on the heat-dissipating unit and contacting the heat-dissipating unit, wherein the first substrate unit includes at least one first function circuit board and a plurality of first function chips electrically connected to the at least one first function circuit board, and the at least one first function circuit board has an external circuit board extended forward from a front side thereof and disposed on the front heat-dissipating body;
a second substrate unit electrically connected to the first substrate unit and contacting the heat-dissipating unit, wherein the second substrate unit includes at least one second function circuit board electrically connected to the at least one first function circuit board and a plurality of second function chips electrically connected to the at least one second function circuit board;
an electrical connecting unit including an electrical connecting casing contacting the front heat-dissipating body and enveloping the front heat-dissipating body and the external circuit board; and
a shell unit including a shell module for enveloping the heat-dissipating unit, the first substrate unit and the second substrate unit and selectively exposing or hiding the electrical connecting unit.

2. The wireless network receiver as claimed in claim 1, wherein the heat-dissipating unit has at least two lateral heat-dissipating bodies respectively extended upward from two opposite lateral sides of the at least one main heat-dissipating body, and the two lateral heat-dissipating bodies respectively contact two opposite lateral sides of the at least one first function circuit board and two opposite lateral sides of the at least one second function circuit board.

3. The wireless network receiver as claimed in claim 2, wherein each lateral heat-dissipating body has a plurality of lateral heat-dissipating fins projected outward from an outer surface thereof, and the at least one main heat-dissipating body has a plurality of bottom heat-dissipating fins projected downward from a bottom side thereof.

4. The wireless network receiver as claimed in claim 1, wherein the first substrate unit includes a first electrical connector disposed on and electrically connected to the at least one first function circuit board, the second substrate unit includes a second electrical connector disposed on and electrically connected to the at least one second function circuit board, and the at least one first function circuit board and the at least one second function circuit board are electrically connected with each other by matching the first electrical connector and the second electrical connector.

5. The wireless network receiver as claimed in claim 1, wherein the electrical connecting casing is fixed on the heat-dissipating unit through a plurality of fixing elements.

6. The wireless network receiver as claimed in claim 1, wherein the second substrate unit has a SIM card connector electrically connected to the at least one second function circuit board, and the shell module has a front opening for exposing an external electrical connector composed of the front heat-dissipating body, the external circuit board and the electrical connecting casing and a top opening for exposing the SIM card connector.

7. The wireless network receiver as claimed in claim 1, wherein the second substrate unit has a SIM card connector electrically connected to the at least one second function circuit board, the shell module includes a top shell and a bottom shell mated with the top shell, the top shell includes a main body, a top cover disposed on the main body and a front cover mated with a front portion of the main body for enveloping the electrical connecting casing, the main body has a top opening for exposing the SIM card connector, the top opening is closed by the top cover, and the bottom shell has a plurality of heat-dissipating holes.

8. The wireless network receiver as claimed in claim 7, wherein the at least one main heat-dissipating body has a receiving groove formed on the bottom surface thereof, the bottom shell has a heat-dissipating opening for exposing the receiving groove and a shielding board received in the heat-dissipating opening, and the at least one main heat-dissipating body has an annular heat-dissipating portion disposed on the bottom surface thereof and between the inner surface of the heat-dissipating opening and the shielding board.

9. A wireless network receiver, comprising:
a heat-dissipating unit having at least one main heat-dissipating body and a front heat-dissipating body extended forward from the at least one main heat-dissipating body;
a first substrate unit disposed on the heat-dissipating unit, wherein the first substrate unit includes at least one first function circuit board and a plurality of first function chips electrically connected to the at least one first function circuit board;
a second substrate unit electrically connected to the first substrate unit, wherein the second substrate unit includes at least one second function circuit board electrically connected to the at least one first function circuit board and a plurality of second function chips electrically connected to the at least one second function circuit board;
an electrical connecting unit including an electrical connecting casing contacting the front heat-dissipating body and enveloping the front heat-dissipating body and a front portion of the at least one first function circuit board; and
a shell unit including a shell module for selectively exposing or hiding the electrical connecting unit.

10. The wireless network receiver as claimed in claim 9, wherein the heat-dissipating unit has at least two lateral heat-dissipating bodies respectively extended upward from two opposite lateral sides of the at least one main heat-dissipating body, and the two lateral heat-dissipating bodies respectively contact two opposite lateral sides of the at least one first function circuit board and two opposite lateral sides of the at least one second function circuit board.

11. The wireless network receiver as claimed in claim 10, wherein each lateral heat-dissipating body has a plurality of lateral heat-dissipating fins projected outward from an outer surface thereof, and the at least one main heat-dissipating body has a plurality of bottom heat-dissipating fins projected downward from a bottom side thereof.

12. The wireless network receiver as claimed in claim 9, wherein the first substrate unit includes a first electrical connector disposed on and electrically connected to the at least one first function circuit board, the second substrate unit includes a second electrical connector disposed on and electrically connected to the at least one second function circuit board, and the at least one first function circuit board and the at least one second function circuit board are electrically connected with each other by matching the first electrical connector and the second electrical connector.

13. The wireless network receiver as claimed in claim 9, wherein the electrical connecting casing is fixed on the heat-dissipating unit through a plurality of fixing elements.

14. The wireless network receiver as claimed in claim 9, wherein the at least one first function circuit board has an external circuit board extended forward from the front portion thereof and disposed on the front heat-dissipating body, the second substrate unit has a SIM card connector electrically connected to the at least one second function circuit board, and the shell module has a front opening for exposing an external electrical connector composed of the front heat-dissipating body, the external circuit board and the electrical connecting casing and a top opening for exposing the SIM card connector.

15. The wireless network receiver as claimed in claim 9, wherein the second substrate unit has a SIM card connector electrically connected to the at least one second function circuit board, the shell module includes a top shell and a bottom shell mated with the top shell, the top shell includes a main body, a top cover disposed on the main body and a front cover mated with a front portion of the main body for enveloping the electrical connecting casing, the main body has a top opening for exposing the SIM card connector, the top opening is closed by the top cover, and the bottom shell has a plurality of heat-dissipating holes.

16. The wireless network receiver as claimed in claim 15, wherein the at least one main heat-dissipating body has a receiving groove formed on the bottom surface thereof, the bottom shell has a heat-dissipating opening for exposing the receiving groove and a shielding board received in the heat-dissipating opening, and the at least one main heat-dissipating body has an annular heat-dissipating portion disposed on the bottom surface thereof and between the inner surface of the heat-dissipating opening and the shielding board.

17. A wireless network receiver, comprising:
a heat-dissipating unit having at least one main heat-dissipating body and a front heat-dissipating body extended forward from the at least one main heat-dissipating body;
a wireless network receiving module disposed on the heat-dissipating unit, wherein the wireless network receiving module includes a first substrate unit and a second substrate unit electrically connected to the first substrate unit;
an electrical connecting unit including an electrical connecting casing contacting the front heat-dissipating body and enveloping the front heat-dissipating body and a front portion of the first substrate unit; and
a shell unit including a shell module for selectively exposing or hiding the electrical connecting unit.

18. The wireless network receiver as claimed in claim 17, wherein the heat-dissipating unit has at least two lateral heat-dissipating bodies respectively extended upward from two opposite lateral sides of the at least one main heat-dissipating body, the two lateral heat-dissipating bodies respectively contact two opposite lateral sides of the first substrate unit and two opposite lateral sides of the second substrate unit, each lateral heat-dissipating body has a plurality of lateral heat-dissipating fins projected outward from an outer surface thereof, and the at least one main heat-dissipating body has a plurality of bottom heat-dissipating fins projected downward from a bottom side thereof.

19. The wireless network receiver as claimed in claim 17, wherein the second substrate unit has a SIM card connector electrically connected to the second substrate unit, the shell module includes a top shell and a bottom shell mated with the top shell, the top shell includes a main body, a top cover disposed on the main body and a front cover mated with a front portion of the main body for enveloping the electrical connecting casing, the main body has a top opening for exposing the SIM card connector, the top opening is closed by the top cover, and the bottom shell has a plurality of heat-dissipating holes.

20. The wireless network receiver as claimed in claim 19, wherein the at least one main heat-dissipating body has a receiving groove formed on the bottom surface thereof, the bottom shell has a heat-dissipating opening for exposing the receiving groove and a shielding board received in the heat-dissipating opening, and the at least one main heat-dissipating body has an annular heat-dissipating portion disposed on the bottom surface thereof and between the inner surface of the heat-dissipating opening and the shielding board.

* * * * *